United States Patent [19]

Rios

[11] Patent Number: 4,680,666

[45] Date of Patent: Jul. 14, 1987

[54] MR MAGNET WIRING HARNESS CIRCUIT

[75] Inventor: Pedro A. Rios, Schenectady, N.Y.

[73] Assignee: General Electric Company, Schenectady, N.Y.

[21] Appl. No.: 848,552

[22] Filed: Apr. 7, 1986

[51] Int. Cl.[4] .......................................... H01H 47/00
[52] U.S. Cl. ..................................... 361/141; 335/301
[58] Field of Search ............... 361/140, 141; 335/284, 335/301; 324/320, 322

[56] References Cited

U.S. PATENT DOCUMENTS 3,263,133  7/1966  Stekly ................................... 361/141
3,488,561  1/1970  Anderson ............................. 324/320

Primary Examiner—L. T. Hix
Assistant Examiner—David M. Gray
Attorney, Agent, or Firm—William H. Steinberg; James C. Davis, Jr.; Paul R. Webb, II

[57] ABSTRACT

A wiring harness for a shielded superconducting magnetic resonance magnet in which resistors are connected in parallel with pairs of symmetrically connected coils. The symmetric nature of the magnetic field can be maintained during a quench since coils placed symmetrically about the plane of symmetry always conduct the same current, eliminating unbalance forces that are normally associated with a quench of a shielded magnet.

2 Claims, 2 Drawing Figures

MR MAGNET WIRING HARNESS CIRCUIT

Background of the Invention

The present invention relates to shielded superconducting magnetic resonance (MR) magnets and more particularly to a MR magnet circuit to eliminate forces between a magnetic shield and a superconducting magnet during quench.

Whole body magnetic resonance magnets used for imaging and spectroscopy produce high intensity dc magnetic fields which can interfere with other diagnostic equipment and patients with cardiac pacemakers and neuro stimulators. Shielded MR magnets are used to reduce the fringe field that surrounds MR magnets to meet the guidelines issued by the Food and Drug Administration. Shielded magnets have the advantage of cutting installation costs by reducing the floor area required surrounding a magnet to achieve field reductions necessary to allow unlimited access by people. Shielded magnets can have room-size magnetic shields, shields that fit closely to the magnet or shields that are integrated with the magnet.

Superconductive electrical materials maintained at a temperature below their critical transition temperatures provide an advantageous means to supply a temporally stable and spacially homogenous magnet field. The superconductor wires that form the superconducting magnet are situated in the innermost cylindrical chamber of a cylindrical cryostat having a longitudinally extending bore. The innermost chamber is coaxial with the cryostat and is typically cooled with liquid helium. The circuit for a magnet typically has six superconductor coils connected in series with a resistor connected in parallel with each of the coils. When the magnet is supercooled and the coils become superconductive, a superconducting switch is closed permitting superconducting current to flow in the series connected coils. The resistance of this series connected circuit is zero. If a coil transitions from the superconductive state to the normal state (quenches), the coil exhibits a resistance and part of the current is diverted to the resistor connected in parallel with it, which previously carried new current. The resistor dissipates a substantial fraction of the energy stored in the coil that quenched, thus preventing damage to the coil through overheating or thermally induced stresses. However, when a coil quenches, the current distribution may no longer be symmetric to the plane of symmetry axially dividing the cylindrical cryostat. Since superconducting magnets used in medical diagnostic applications operate at high or moderately high field levels (0.5 Tesla and up) the forces between the coils and the magnetic shield will be high when the symmetric current distribution in the coils is lost. Substantial forces are generated between the magnet coils and the magnet shield when the quench occurs. These forces dominate the design of the magnet supports. The magnet supports bridge the temperature difference between the innermost vessel at a temperature of 4.2° K. and the ambient temperature of 300° K. The increase in cross section of the magnet supports causes an increase in the heat load that must be dissipated by cryogenic coolant evaporation.

It is an object of the present invention to provide a MR magnet wiring harness circuit for a shielded MR magnet that maintains the same current flow in coils symmetrically placed about the plane of symmetry, during a quench.

It is a further object of the present invention to provide a MR magnet wiring harness circuit for a shielded MR magnet that permits magnet coil supports to be designed to minimize the heat conducted to the helium vessel rather than to withstand forces that occur during a quench.

Summary of the Invention

In one aspect of the present invention a wiring harness circuit for a shielded superconducting magnetic resonance magnet is provided. The wiring harness comprises a plurality of coils of superconductor wire connected in series with one another and symmetrically arranged about a plane of symmetry. A plurality of resistors is provided with each resistor connected in parallel with a symmetric pair of coils of superconductor wire so that in the event of a quench in any one coil the same current flows in the coil symmetrically located with the quenched coil.

Brief Description of the Drawing

While the specification concludes with claims particularly pointing out and distinctly claiming the present invention, objects and advantages of the invention can be more readily ascertained from the following description of a preferred embodiment when used in conjunction with the accompanying drawing in which:

Detailed Description of the Drawing

Figure 1:
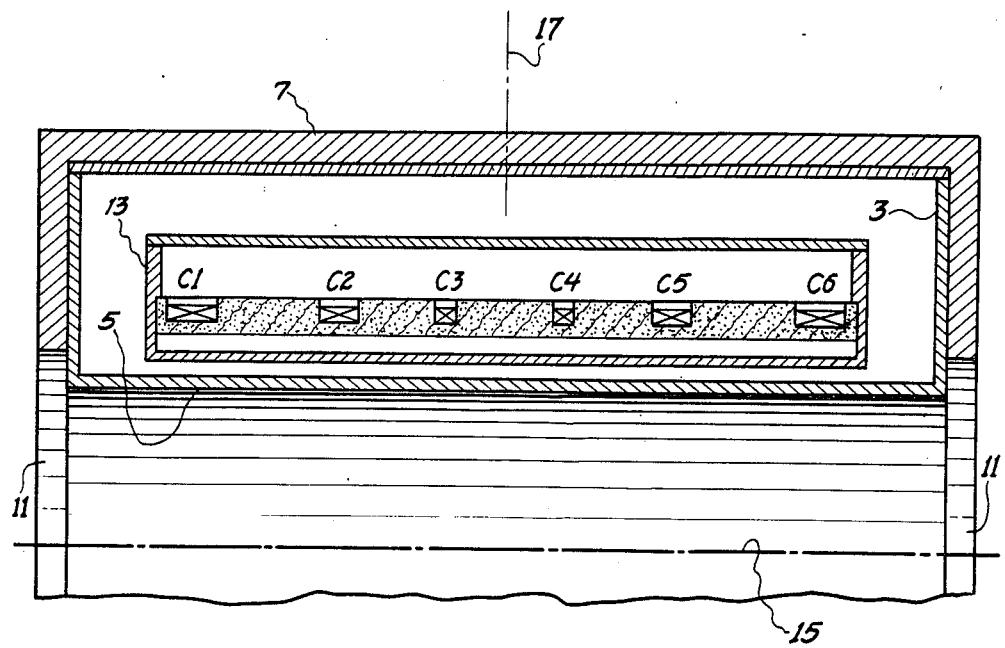
FIG. 1 is a partial sectional view of a shielded superconducting magnetic resonance magnet.

Referring now the drawing wherein like elements are designated by like reference numerals throughout and particularly FIG. 1 thereof, a cylindrical cryostat vacuum enclosure 3 having a longitudinally extending bore 5 therethrough is shown. An iron shield 7 having the shape of a cylindrical shell is shown surrounding the cryostat. Apertures 11 are provided in the ends of the shields to permit patient access inside the magnet. An inner helium cylindrical vessel 13 is shown nested inside the cryostat vacuum enclosure 3. The helium vessel contains six coils C1, C2, C3, C4, C5 and C6 of superconductor wire positioned to provide a homogenous field inside the bore of the cryostat. The coils are symmetrically disposed about a longitudinally extending center line 15 and are symmetrically disposed about an axial plane 17 of the cryostat 3. Resistors are also situated in the helium vessel 13 but are not shown in FIG. 1. The resistors can comprise brass plates or lengths of brass wire.

Figure 2:
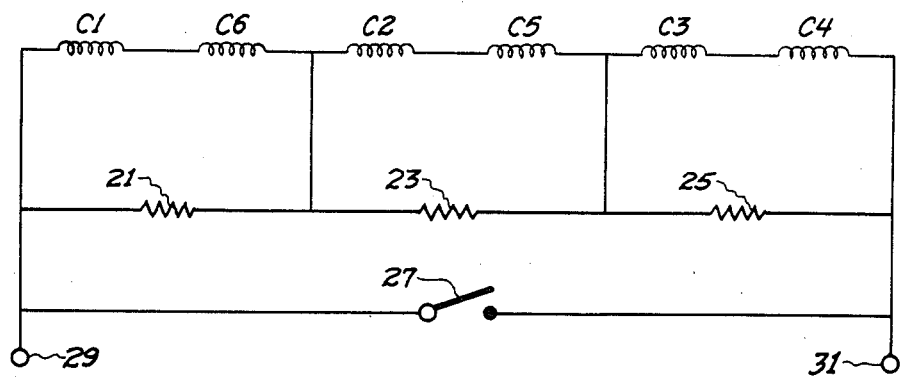
FIG. 2 is a magnet wiring harness circuit for the shielded superconducting magnetic resonance magnet of FIG. 1, in accordance with the present invention.

Referring now to FIGS. 1 and 2 a wiring harness circuit is shown in FIG. 2 with the coils C1-C6 connected in series with one another and a resistor 21 connected in parallel with coils C1 and C6. Coils C1 and C6 are symmetrically situated about the axial plane 17. A resistor 23 is connected in parallel with coils C2 and C5 which are also symmetrically situated about the axial plane 17. A resistor 25 is connected in parallel with coils C3 and C4 which are symmetrically situated about the axial plane 17. A superconducting switch 27 is connected across the series connected coils C1-C6. Two terminals 29 and 31 are also provided connected to either end of the series connected coils. To excite the coils C1–C6 a power source is connected to terminals 29 and 31 with the switch 27 in the open position. When the desired current flow is established in the super cooled coils, switch 27 is closed and the power source removed from the terminals 29 and 31. Current continues to flow because of the zero resistance of the supercooled superconducting wire. During magnet operation, the current in the magnet situated symmetrically about the longitudinal center line of the cryostat and situated symmetrically about the axial plane results in the forces produced by the magnetic fields being balanced. The external magnet supports (not shown) that bridge the temperature difference between 4.2° K. inner helium vessel and 300° K. ambient temperature cryostats need not support these balanced forces.

If a coil transitions to normal (quenches) the coil exhibits a resistance and part of the current flowing in the coil is diverted to the resistor in parallel with it. The resistor dissipates a substantial fraction of the energy stored in the coil thus preventing damage to the coil from overheating or thermally induced stresses. Because symmetric coils have the same resistor connected in parallel therewith, the same current flows in the symmetric coils even when one of them quenches. Therefore, unbalanced forces that normally occur in shielded magnets when a quench occurs, do not occur in the present invention. When the external magnet supports are designed, they can be designed to minimize the heat conduction to the liquid helium from the ambient without taking into account unbalanced forces during a quench.

In a magnet coil arangement with five coils, for example, where a center coil is symmetrically arranged about the axial plane of symmetry, each of the symmetric coil pairs can be connected in parallel with a resistor and the center coil connected in parallel with a resistor. Alternatively, a resistor can be connected in parallel with the inner pair of coils and the center coil as well. Resistor values are chosen based on the desired time constant of the circuit. The use of a single resistor connected in parallel to protect all the coils is unattractive in large magnets because of the level of energy dissipation required in the resistor during a quench.

The foregoing describes a wiring harness circuit for a shielded superconducting magnetic resonance magnet that maintains the same current flow in coils symmetrically placed about the plane of symmetry, during a quench and which permits magnetic coil supports that are designed to minimize the heat conducted to the helium vessel rather than designed to withstand forces that occur during a quench.

While the invention has been particularly shown and described with reference to a preferred embodiment thereof, it will be understood by those skilled in the art that various changes in form and detail may be made without departing from the spirit and scope of the invention.

What is claimed is:

1. A wiring harness circuit for a shielded superconducting magnetic resonance magnet comprising:
    a plurality of coils of superconductor wire connected in series with one another, said coils symmetrically arranged about a plane of symmetry; and
    a plurality of resistors, each said resistor connected in parallel with a symmetric pair of coils so that a quench in any one coil results in the same current flow in the coil symmetric thereto.

2. A wiring harness circuit for a shielded superconducting magnetic resonance magnet comprising:
    a plurality of coaxial coils of superconductor wire connected in series with one another, said coils symmetrically arranged about an axial plane of symmetry; and
    a plurality of resistors, each said resistor connected in parallel with a; symmetric pair of coils so that a quench in any one coil results in the same current flow in the coil symmetric thereto.

* * * * *